United States Patent
Hwang et al.

(10) Patent No.: US 11,392,152 B2
(45) Date of Patent: Jul. 19, 2022

(54) VOLTAGE GENERATION CIRCUIT AND INPUT BUFFER INCLUDING THE VOLTAGE GENERATION CIRCUIT

(71) Applicant: SK hynix Inc., Icheon-si Gyeonggi-do (KR)

(72) Inventors: Jin Ha Hwang, Icheon-si Gyeonggi-do (KR); Soon Sung An, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 207 days.

(21) Appl. No.: 16/877,975

(22) Filed: May 19, 2020

(65) Prior Publication Data

US 2021/0103306 A1 Apr. 8, 2021

(30) Foreign Application Priority Data

Oct. 4, 2019 (KR) .................... 10-2019-0122901

(51) Int. Cl.
*H03F 3/45* (2006.01)
*G05F 1/46* (2006.01)
*G05F 3/24* (2006.01)
*H03K 17/22* (2006.01)

(52) U.S. Cl.
CPC .............. *G05F 1/465* (2013.01); *G05F 3/245* (2013.01); *H03F 3/45076* (2013.01); *H03K 17/223* (2013.01)

(58) Field of Classification Search
None
See application file for complete search history.

(56) References Cited

U.S. PATENT DOCUMENTS

| 5,717,360 A * | 2/1998 | Vu ........................ H03F 3/3008 |
| | | 330/253 |
| 5,818,212 A | 10/1998 | Min et al. |
| 7,646,234 B2 * | 1/2010 | Dubey ................... G11C 5/147 |
| | | 327/541 |
| 10,250,199 B2 * | 4/2019 | Klaren ..................... H03F 3/195 |
| 10,672,726 B2 * | 6/2020 | Englekirk ......... H01L 29/78618 |
| 2018/0294784 A1 | 10/2018 | Kim et al. |

* cited by examiner

*Primary Examiner* — Cassandra F Cox
(74) *Attorney, Agent, or Firm* — William Park & Associates Ltd.

(57) ABSTRACT

A voltage generation circuit may include: a first transistor coupled to an internal supply voltage terminal, and configured as a diode-connected transistor; a second transistor coupled to the first transistor and configured as a diode-connected transistor; and a third transistor coupled between the second transistor and a ground voltage terminal, and configured to operate according to a first reference voltage generated based on an external supply voltage. The voltage generation circuit may limit a variation in level of a second reference voltage which is generated through a drain terminal of the second transistor as a threshold voltage of the second transistor rises according to a rise in level of the internal supply voltage.

9 Claims, 4 Drawing Sheets

VOLTAGE GENERATION CIRCUIT AND INPUT BUFFER INCLUDING THE VOLTAGE GENERATION CIRCUIT

CROSS-REFERENCES TO RELATED APPLICATION

The present application claims priority under 35 U.S.C. § 119(a) to Korean application number 10-2019-0122901, filed on Oct. 4, 2019, in the Korean Intellectual Property Office, which is incorporated herein by reference in its entirety.

BACKGROUND

1. Technical Field

Various embodiments generally relate to a semiconductor circuit, and more particularly, to a voltage generation circuit and an input buffer including the voltage generation circuit.

2. Related Art

A semiconductor circuit includes an input buffer for receiving an input signal provided from the outside of the semiconductor circuit.

The input buffer may operate according to different types of supply voltages, i.e. a supply voltage provided from the outside (hereafter, referred to as an external supply voltage) or/and a supply voltage provided from the inside (hereafter, referred to as an internal supply voltage).

It is very important for the input buffer to have a stable output characteristic regardless of variations in different types of supply voltages.

SUMMARY

In an embodiment, a voltage generation circuit may include: a first transistor coupled to an internal supply voltage terminal, and configured as a diode-connected transistor; a second transistor coupled to the first transistor and configured as a diode-connected transistor; and a third transistor coupled between the second transistor and a ground voltage terminal, and configured to operate according to a first reference voltage generated based on an external supply voltage. The voltage generation circuit may limit a variation in level of a second reference voltage which is generated through a drain terminal of the second transistor as a threshold voltage of the second transistor rises according to a rise in level of the internal supply voltage.

In an embodiment, an input buffer may include: an amplifier circuit configured to receive an internal supply voltage, and generate an output signal by amplifying an input signal according to a compensation bias voltage and a first reference voltage generated based on an external supply voltage; and a compensation circuit configured to generate the compensation bias voltage according to a pre-compensation signal generated through a replica circuit configured by replicating the amplifier circuit and a second reference voltage generated by the compensation circuit, wherein the compensation circuit generates the second reference voltage having a level that is restricted from varying according to a rise in level of the internal supply voltage.

DETAILED DESCRIPTION

Hereinafter, a voltage generation circuit and an input buffer including the same according to the present disclosure will be described below with reference to the accompanying drawings through various examples of embodiments.

Various embodiments are directed to a voltage generation circuit which can have a stable output characteristic regardless of a variation in supply voltage, and an input buffer including the same.

Figure 1:
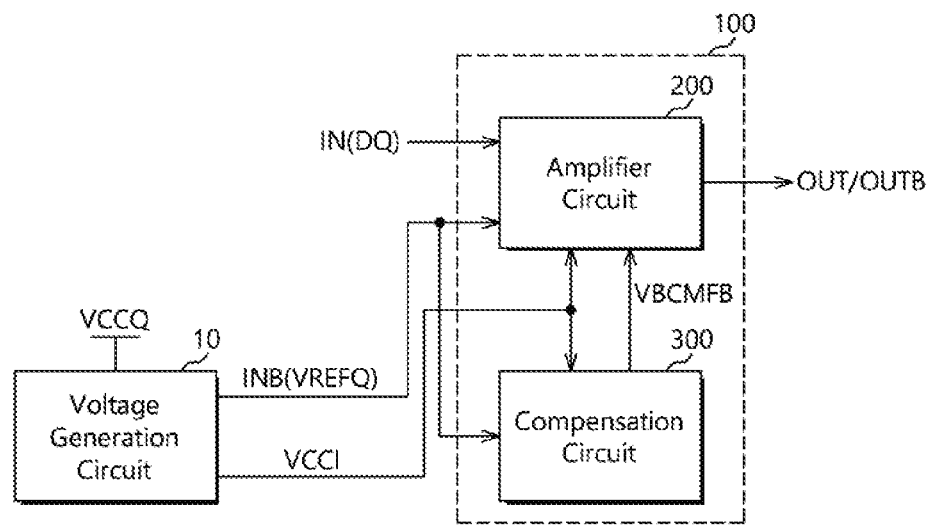
FIG. 1 is a diagram illustrating a configuration of an input buffer in accordance with an embodiment.

FIG. 1 is a diagram illustrating a configuration of an input buffer in accordance with an embodiment.

Referring to FIG. 1, the input buffer 100 in accordance with an embodiment may include an amplifier circuit 200 and a compensation circuit 300.

The amplifier circuit 200 may generate differential output signals OUT/OUTB by amplifying differential input signals IN/INB according to an internal supply voltage VCCI and a compensation bias voltage VBCMFB.

A data signal DQ may be inputted as the differential input signal IN of the differential input signals IN/INB, and a first reference voltage VREFQ may be inputted as the differential input signal INB of the differential input signals IN/INB.

The compensation circuit 300 may include a replica circuit configured by replicating the amplifier circuit 200, and generate the compensation bias voltage VBCMFB according to the internal supply voltage VCCI and any one of the differential input signals IN/INB, for example, the differential input signal INB.

The internal supply voltage VCCI and the first reference voltage VREFQ may be generated by a circuit included in a semiconductor apparatus in which the input buffer 100 in accordance with an embodiment is used, for example, a voltage generation circuit 10.

The voltage generation circuit 10 may generate an internal supply voltage VCCI and the first reference voltage VREFQ using an external supply voltage VCCQ. The external supply voltage VCCQ may be provided from an outside of the semiconductor circuit including the input buffer 100.

Figure 2:
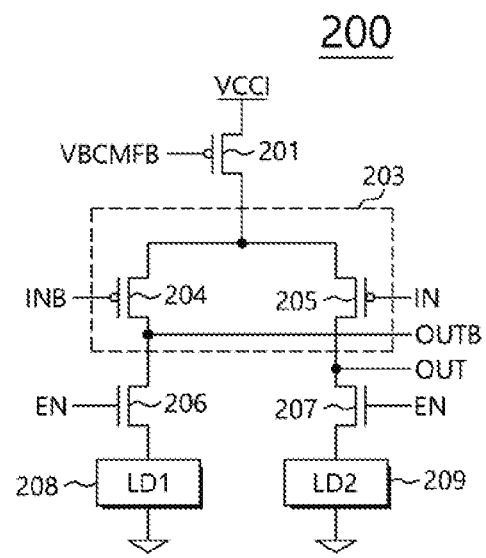
FIG. 2 is a diagram illustrating a configuration of an amplifier circuit of FIG. 1.

FIG. 2 is a diagram illustrating the configuration of the amplifier circuit of FIG. 1.

Referring to FIG. 2, the amplifier circuit 200 may include a plurality of transistors 201, 204, 205, 206 and 207 and a plurality of loads (LD1 and LD2) 208 and 209.

A first transistor 201 may operate as a current source configured to adjust the amount of current according to the internal supply voltage VCCI in response to the compensation bias voltage VBCMFB.

The first transistor 201 may have a source terminal configured to receive the internal supply voltage VCCI and a gate terminal configured to receive the compensation bias voltage VBCMFB.

The first transistor 201 may have a drain terminal coupled to a source terminal of a second transistor 204 and a source terminal of a third transistor 205.

The second transistor 204 and the third transistor 205 may constitute a differential pair 203.

The second transistor 204 may receive the differential input signal INB of the differential input signals IN/INB through a gate terminal thereof, and generate the differential output signal OUTB of the differential output signals OUT/OUTB through a drain terminal thereof.

The third transistor 205 may receive the differential input signal IN of the differential input signals IN/INB through a gate terminal thereof, and generate the differential output signal OUT of the differential output signals OUT/OUTB through a drain terminal thereof.

A fourth transistor 206 may have a drain terminal coupled to the drain terminal of the second transistor 204 and a gate terminal configured to receive an enable signal EN.

A first load (LD1) 208 has one terminal coupled to a ground terminal and the other terminal coupled to a source terminal of the fourth transistor 206.

A fifth transistor 207 may have a drain terminal coupled to the drain terminal of the third transistor 205 and a gate terminal configured to receive the enable signal EN.

A second load (LD2) 209 has one terminal coupled to the ground terminal and the other terminal coupled to a source terminal of the fifth transistor 207.

The above-described amplifier circuit 200 may generate the differential output signals OUT/OUTB by amplifying the data signal DQ according to the first reference voltage VREFQ during an active interval (for example, a high-level interval) of the enable signal EN, and correct the levels of the differential output signals OUT/OUTB according to the compensation bias voltage VBCMFB.

Since the compensation bias voltage VBCMFB has a value obtained by compensating for a variation in the internal supply voltage VCCI, the amplifier circuit 200 in accordance with an embodiment may control the differential output signals OUT/OUTB to have a stable level.

Although not illustrated, the amplifier circuit 200 may further include a slicer and a rail-to-rail amplifier circuit for converting the levels of the differential output signals OUT/OUTB to voltage levels of which a complementary metal-oxide-semiconductor (CMOS) circuit will operate or recognize.

Figure 3:
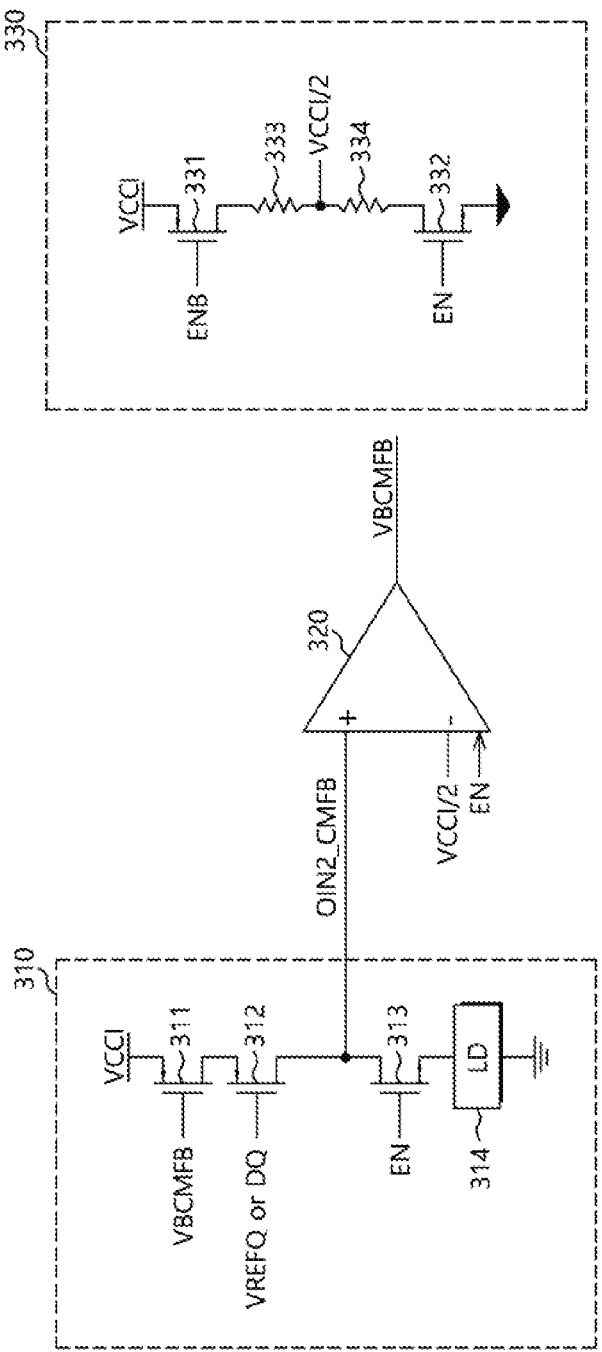
FIG. 3 is a diagram illustrating a configuration of a compensation circuit of FIG. 1.

FIG. 3 is a diagram illustrating the configuration of the compensation circuit of FIG. 1.

Referring to FIG. 3, the compensation circuit 300 may include a replica circuit 310, a differential amplifier 320 and a voltage generation circuit 330.

The replica circuit 310 may be configured by replicating the amplifier circuit 200 of FIG. 2, and thus have the same electrical characteristics as the amplifier circuit 200.

The replica circuit 310 may include a plurality of transistors 311 to 313 and a load (LD) 314.

A first transistor 311 may operate as a current source configured to adjust the amount of current according to the internal supply voltage VCCI in response to the compensation bias voltage VBCMFB.

The first transistor 311 may have a source terminal configured to receive the internal supply voltage VCCI and a gate terminal configured to receive the compensation bias voltage VBCMFB.

The first transistor 311 may have a drain terminal coupled to a source terminal of a second transistor 312.

The second transistor 312 may receive the first reference voltage VREFQ or DQ through a gate terminal thereof, and generate a pre-compensation signal OIN2_CMFB through a drain terminal thereof.

A third transistor 313 may have a drain terminal coupled to the drain terminal of the second transistor 312 and a gate terminal configured to receive the enable signal EN.

The load (LD) 314 may have one terminal coupled to the ground terminal and the other terminal coupled to a source terminal of the third transistor 313.

The differential amplifier 320 may generate the compensation bias voltage VBCMFB by comparing the pre-compensation signal OIN2_CMFB and a divided voltage VCCI/2 during, for example, a high-level interval of the enable signal EN.

The voltage generation circuit 330 may generate the divided voltage VCCI/2 by dividing the internal supply voltage VCCI.

The voltage generation circuit 330 may include a plurality of transistors 331 and 332 and divider resistors 333 and 334.

A first transistor 331 may have a source terminal configured to receive the internal supply voltage VCCI and a gate terminal configured to receive an inverted enable signal ENB.

A first resistor 333 may have one terminal coupled to a drain terminal of the first transistor 331.

A second resistor 334 may have one terminal coupled to the other terminal of the first resistor 333.

In an embodiment, the case in which the divided voltage VCCI/2 has a value corresponding to a half of the internal supply voltage VCCI has been used as an example, and the first and second resistors 333 and 334 may be designed to have the same resistance value. Since the first and second resistors 333 and 334 have the same resistance value, the divided voltage VCCI/2 corresponding to a half of the internal supply voltage VCCI may be generated from a node to which the first and second resistors 333 and 334 are coupled.

A second transistor 332 may have a drain terminal coupled to the other terminal of the second resistor 334, a gate terminal configured to receive the enable signal EN, and a source terminal coupled to the ground terminal.

The operation of the input buffer 100 in accordance with an embodiment, which has the above-described configuration, will be described as follows.

The replica circuit 310 of the above-described compensation circuit 300 may have the same electrical characteristics as the amplifier circuit 200 of FIG. 2. Therefore, the pre-compensation signal OIN2_CMFB outputted from the replica circuit 310 may be controlled to have the same voltage level change as any one of the different output signals OUT/OUTB outputted from the amplifier circuit 200.

Since the differential amplifier 320 generates the compensation bias voltage VBCMFB by comparing the pre-compensation signal OIN2_CMFB and the divided voltage VCCI/2, the compensation bias voltage VBCMFB may have a value obtained by compensating for a variation in the internal supply voltage VCCI.

The amplifier circuit 200 generates the differential output signals OUT/OUTB by amplifying the differential input signals IN/INB according to the compensation bias voltage VBCMFB.

Therefore, the differential output signals OUT/OUTB may have stable levels regardless of a variation in the internal supply voltage VCCI.

Figure 4:
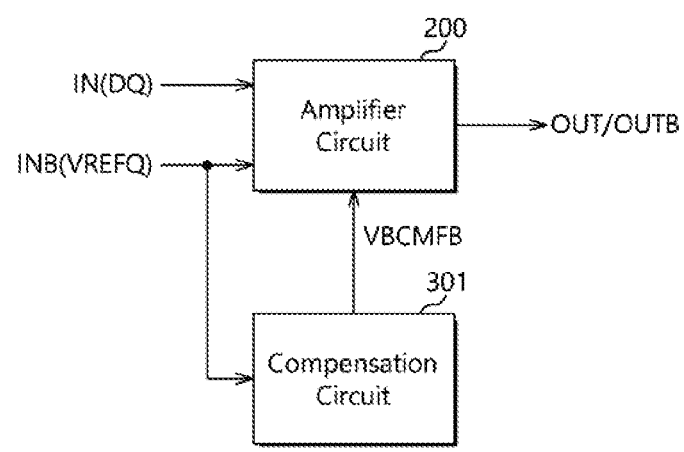
FIG. 4 is a diagram illustrating a configuration of an input buffer in accordance with another embodiment.

FIG. 4 is a diagram illustrating a configuration of an input buffer in accordance with an embodiment.

Referring to FIG. 4, the input buffer 101 in accordance with an embodiment may include an amplifier circuit 200 and a compensation circuit 301.

The amplifier circuit 200 may generate differential output signals OUT/OUTB by amplifying differential input signals IN/INB according to a compensation bias voltage VBCMFB.

A data signal DQ may be inputted as the differential input signal IN of the differential input signals IN/INB, and a first reference voltage VREFQ may be inputted as the differential input signal INB of the differential input signals IN/INB.

The amplifier circuit 200 may be configured in the same manner as FIG. 2.

The compensation circuit 301 may include a replica circuit configured by replicating the amplifier circuit 200, and generate the compensation bias voltage VBCMFB according to any one of the differential input signals IN/INB, for example, the differential input signal INB.

The compensation circuit 301 may control the compensation bias voltage VBCMFB to have a change less sensitive to a variation in the internal supply voltage VCCI than that in the external supply voltage VCCQ.

The compensation circuit 301 may control the compensation bias voltage VBCMFB to have a level that is insensitive to a variation in an internal supply voltage VCCI and obtained by compensating for a variation in the external supply voltage VCCQ.

Figure 5:
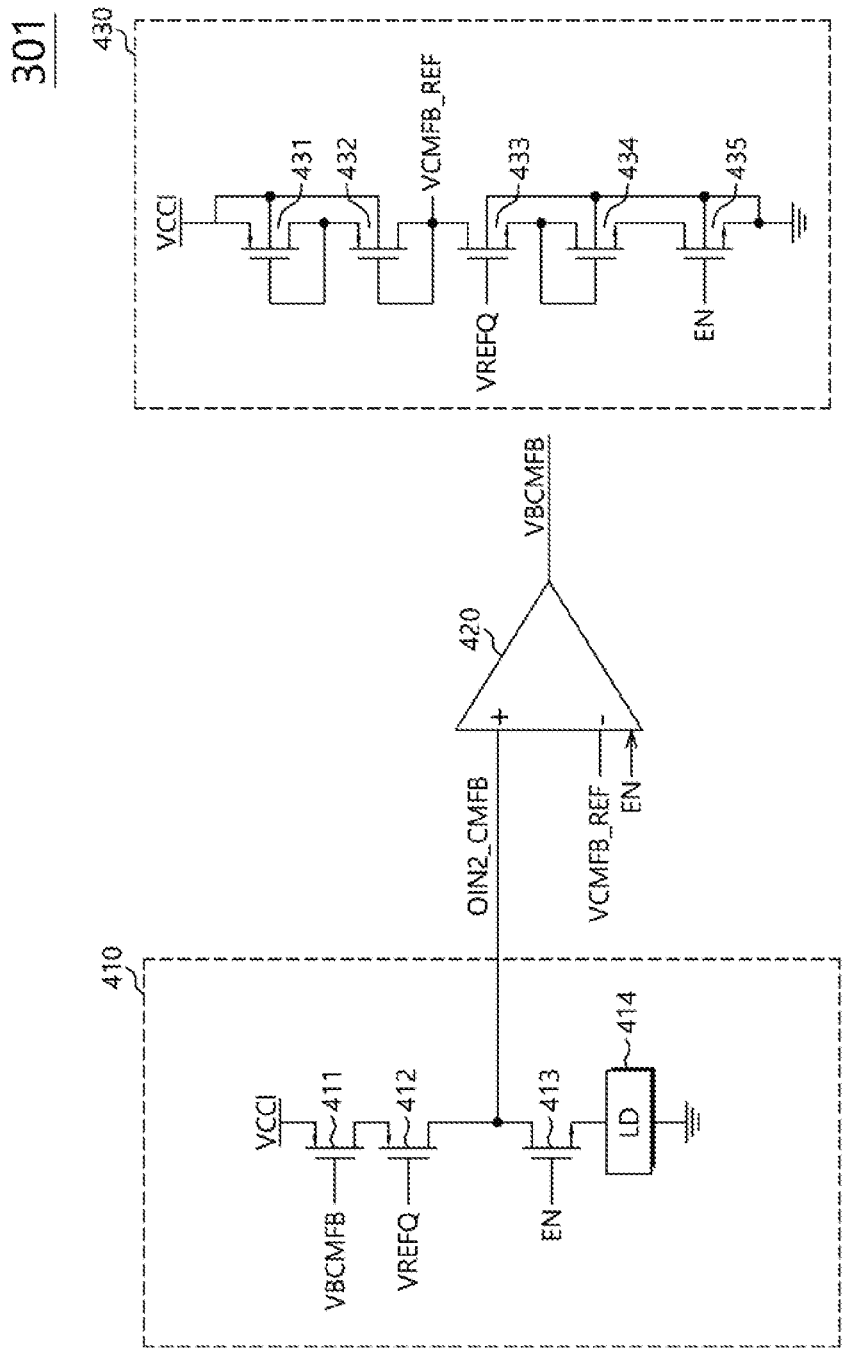
FIG. 5 is a diagram illustrating a configuration of a compensation circuit of FIG. 4.

FIG. 5 is a diagram illustrating the configuration of the compensation circuit of FIG. 4.

Referring to FIG. 5, the compensation circuit 301 may include a replica circuit 410, a differential amplifier 420 and a voltage generation circuit 430.

The replica circuit 410 may be configured by replicating the amplifier circuit 200, and thus have the same electrical characteristics as the amplifier circuit 200.

The replica circuit 410 may include a plurality of transistors 411 to 413 and a load (LD) 414.

A first transistor 411 may operate as a current source configured to adjust the amount of current according to the internal supply voltage VCCI in response to the compensation bias voltage VBCMFB.

The first transistor 411 may have a source terminal configured to receive the internal supply voltage VCCI and a gate terminal configured to receive the compensation bias voltage VBCMFB.

The first transistor 411 may have a drain terminal coupled to a source terminal of a second transistor 412.

The second transistor 412 may receive the first reference voltage VREFQ through a gate terminal thereof and generate a pre-compensation signal OIN2_CMFB through a drain terminal thereof.

A third transistor 413 may have a drain terminal coupled to the drain terminal of the second transistor 412 and a gate terminal configured to receive an enable signal EN.

The load 414 has one terminal coupled to a ground terminal and the other terminal coupled to a source terminal of the third transistor 413.

The differential amplifier 420 may generate the compensation bias voltage VBCMFB by comparing the pre-compensation signal OIN2_CMFB and a second reference voltage VCMFB_REF during, for example, a high-level interval of the enable signal EN.

The differential amplifier 420 may raise the level of the compensation bias voltage VBCMFB as the level of the second reference voltage VCMFB_REF falls, and lower the level of the compensation bias voltage VBCMFB as the level of the second reference voltage VCMFB_REF rises.

The voltage generation circuit 430 may generate the second reference voltage VCMFB_REF according to the internal supply voltage VCCI and the first reference voltage VREFQ.

The voltage generation circuit 430 may generate the second reference voltage VCMFB_REF which has a change less sensitive to a variation in the internal supply voltage VCCI than that in the external supply voltage VCCQ, according to the internal supply voltage VCCI and the first reference voltage VREFQ.

The voltage generation circuit 430 may generate the second reference voltage VCMFB_REF which is insensitive to a variation in the internal supply voltage VCCI and has a level obtained by compensating for a variation in the external supply voltage VCCQ, according to the internal supply voltage VCCI and the first reference voltage VREFQ.

The voltage generation circuit 430 may include a plurality of transistors 431 to 435 coupled between the internal supply voltage terminal VCCI and a ground voltage terminal.

A first transistor 431 may have a source terminal configured to receive the internal supply voltage VCCI and a gate terminal coupled to a drain terminal thereof.

A second transistor 432 may have a source terminal coupled to the drain terminal of the first transistor 431 and a gate terminal coupled to a drain terminal thereof.

Each of the first and second transistors 431 and 432 may have a diode-connected configuration in which the gate and drain terminals thereof are coupled to each other. The first transistor 431 may be referred to as a first diode-connected transistor, and the second transistor 432 may be referred to as a second diode-connected transistor.

The internal supply voltage VCCI may be applied to a bulk terminal of the first transistor 431 and a bulk terminal of the second transistor 432.

A third transistor 433 may have a drain terminal coupled to the drain terminal of the second transistor 432 and a gate terminal configured to receive the first reference voltage VREFQ.

The second reference voltage VCMFB_REF may be generated from a node to which the drain terminal of the second transistor 432 and the drain terminal of the third transistor 433 are coupled.

A fourth transistor 434 may have a drain terminal coupled to a source terminal of the third transistor 433 and a gate terminal coupled to the drain terminal thereof.

A fifth transistor 435 may have a drain terminal coupled to a source terminal of the fourth resistor 434, a gate terminal configured to receive the enable signal EN, and a source terminal configured to receive a ground voltage.

The ground voltage may be applied to a bulk terminal of the third transistor 433, a bulk terminal of the fourth transistor 434 and a bulk terminal of the fifth transistor 435.

The operation of the input buffer 101 in accordance with an embodiment, which has the above-described configuration, will be described as follows.

The voltage generation circuit 430 has a single current path structure including the plurality of transistors 431 to 435 coupled in series between the internal supply voltage terminal VCCI and the ground voltage terminal, and the first reference voltage VREFQ is applied to the gate terminal of the third transistor 433. Therefore, since a drain-source voltage Vds of the third transistor 433 is reduced when the level of the first reference voltage VREFQ rises, that is, when the level of the external supply voltage VCCQ rises, the voltage generation circuit 430 may lower the level of the second reference voltage VCMFB_REF.

The voltage generation circuit 430 may generate the second reference voltage VCMFB_REF at a level that is inversely proportional to the level of the external supply voltage VCCQ.

Since the first and second transistors 431 and 432 are diode-connected transistors and receive the internal supply voltage VCCI through the bulk terminals thereof, the threshold voltages of the first and second transistors 431 and 432 rise and fall according to the rise and fall in level of the internal supply voltage VCCI.

As the threshold voltages of the first and second transistors 431 and 432 rise and fall, a variation in the second reference voltage VCMFB_REF by the rise and fall of the internal supply voltage VCCI may be limited.

The limiting of the variation in the second reference voltage VCMFB_REF may correspond to the case in which the first and second transistors 431 and 432 are configured as diode-connected transistors, but does not correspond to the case of a general transistor to which a diode-connected structure is not applied.

As described above, the voltage generation circuit 430 may generate the second reference voltage VCMFB_REF to have a level that is insensitive to a variation in level of the internal supply voltage VCCI and inversely proportional to the level of the external supply voltage VCCQ.

The differential amplifier 420 may raise and lower the level of the compensation bias voltage VBCMFB as the level of the second reference voltage VCMFB_REF rises and falls.

Since the compensation bias voltage VBCMFB is changed in inverse proportion to the second reference voltage VCMFB_REF, the compensation bias voltage VBCMFB has a level which is insensitive to a variation in level of the internal supply voltage VCCI and obtained by compensating for a variation in level of the external supply voltage VCCQ.

The amplifier circuit 200 may generate the differential output signals OUT/OUTB by amplifying the differential input signals IN/INB according to the compensation bias voltage VBCMFB.

Therefore, the differential output signals OUT/OUTB may have stable levels regardless of variations in the internal supply voltage VCCI and the external supply voltage VCCQ.

While various embodiments have been described above, it will be understood to those skilled in the art that the embodiments described are examples only. Accordingly, the operating method of a data storage device described herein should not be limited based on the described embodiments.

What is claimed is:

1. An input buffer comprising:
    an amplifier circuit configured to receive an internal supply voltage, and generate an output signal by amplifying an input signal according to a compensation bias voltage and a first reference voltage generated based on an external supply voltage; and
    a compensation circuit configured to generate the compensation bias voltage according to a pre-compensation signal generated through a replica circuit configured by replicating the amplifier circuit and a second reference voltage generated by the compensation circuit,
    wherein the compensation circuit generates the second reference voltage having a level that is restricted from varying according to a rise in level of the internal supply voltage.

2. The input buffer according to claim 1, wherein the compensation circuit generates the second reference voltage in inverse proportion to a variation in level of the first reference voltage.

3. The input buffer according to claim 1, wherein the amplifier circuit comprises:
    a current source configured to adjust the amount of current according to the compensation bias voltage; and
    a differential pair coupled between the current source and a ground voltage terminal, and configured to generate the output signal by amplifying the input signal.

4. The input buffer according to claim 1, wherein the compensation circuit comprises:
    a differential amplifier configured to generate the compensation bias voltage by comparing the pre-compensation signal and the second reference voltage; and
    a voltage generation circuit configured to generate the second reference voltage which has a change less sensitive to a variation in the internal supply voltage than that in the external supply voltage, according to the internal supply voltage and the first reference voltage.

5. The input buffer according to claim 4, wherein the voltage generation circuit comprises:
    a first transistor configured to receive the internal supply voltage, and configured as a diode-connected transistor;
    a second transistor coupled to the first transistor and configured as a diode-connected transistor; and
    a third transistor coupled between the second transistor and a ground voltage terminal, and configured to operate according to the first reference voltage,
    wherein the voltage generation circuit limits a variation in level of the second reference voltage which is generated through a drain terminal of the second transistor as a threshold voltage of the second transistor rises according to a rise in level of the internal supply voltage.

6. The input buffer according to claim 5, wherein the internal supply voltage is applied to a bulk terminal of at least one of the first and second transistors.

7. The input buffer according to claim 5, further comprising a fourth transistor coupled between the third transistor and the ground voltage terminal.

8. The input buffer according to claim 7, wherein the fourth transistor is configured as a diode-connected transistor.

9. The input buffer according to claim 7, wherein the ground voltage is applied to a bulk terminal of the fourth transistor.

* * * * *